United States Patent
Tseng et al.

(10) Patent No.: US 10,563,006 B2
(45) Date of Patent: Feb. 18, 2020

(54) RESIN COMPOSITION, AND PREPREG, METAL-CLAD LAMINATE, AND PRINTED CIRCUIT BOARD PREPARED USING THE SAME

(71) Applicant: Taiwan Union Technology Corporation, Chupei, Hsinchu County (TW)

(72) Inventors: Guan-Syun Tseng, Chupei (TW); Ju-Ming Huang, Chupei (TW); Tsung-Hsien Lin, Chupei (TW); Chang-Chien Yang, Chupei (TW); Chih-Wei Liao, Chupei (TW)

(73) Assignee: TAIWAN UNION TECHNOLOGY CORPORATION, Chupei, Hsinchu County (TW)

( * ) Notice: Subject to any disclaimer, the term of this patent is extended or adjusted under 35 U.S.C. 154(b) by 70 days.

(21) Appl. No.: 15/664,156

(22) Filed: Jul. 31, 2017

(65) Prior Publication Data
US 2018/0044467 A1    Feb. 15, 2018

Related U.S. Application Data

(60) Provisional application No. 62/372,873, filed on Aug. 10, 2016.

(51) Int. Cl.
| | | |
|---|---|---|
| *C08G 59/62* | (2006.01) | |
| *C08G 59/40* | (2006.01) | |
| *H05K 1/03* | (2006.01) | |
| *C08G 59/32* | (2006.01) | |
| *C08G 59/34* | (2006.01) | |
| *C08G 59/68* | (2006.01) | |
| *C08J 5/24* | (2006.01) | |
| *C08L 63/04* | (2006.01) | |
| *H05K 1/02* | (2006.01) | |
| *C08L 63/00* | (2006.01) | |
| *C08K 3/36* | (2006.01) | |

(52) U.S. Cl.
CPC ....... *C08G 59/621* (2013.01); *C08G 59/3218* (2013.01); *C08G 59/34* (2013.01); *C08G 59/4014* (2013.01); *C08G 59/4071* (2013.01); *C08G 59/686* (2013.01); *C08J 5/24* (2013.01); *C08L 63/00* (2013.01); *C08L 63/04* (2013.01); *H05K 1/02* (2013.01); *H05K 1/0326* (2013.01); *C08J 2363/00* (2013.01); *C08J 2363/04* (2013.01); *C08J 2463/00* (2013.01); *C08J 2463/04* (2013.01); *C08J 2463/08* (2013.01); *C08L 2203/20* (2013.01); *C08L 2205/02* (2013.01); *C08L 2205/025* (2013.01); *C08L 2205/035* (2013.01); *C08L 2205/05* (2013.01)

(58) Field of Classification Search
CPC .. C08G 59/621; C08G 59/3218; C08G 59/34; C08G 59/4014; C08G 59/4071; C08G 59/686; C08J 5/24; C08J 2463/00; C08J 2363/00; C08J 2363/04; C08J 2463/04; C08J 2463/08; C08L 63/00; C08L 63/04; C08L 2203/20; C08L 2205/02; C08L 2205/025; C08L 2205/035; C08L 2205/05; H05K 1/02; H05K 1/0326
USPC ........................................... 523/427
See application file for complete search history.

(56) References Cited

U.S. PATENT DOCUMENTS

| | | | |
|---|---|---|---|
| 2007/0219295 A1* | 9/2007 | Levchik ............. | C08G 59/4071 523/451 |
| 2011/0278052 A1* | 11/2011 | Hsu ..................... | C08G 59/4071 174/258 |
| 2012/0097437 A1 | 4/2012 | Liao et al. | |
| 2013/0251989 A1* | 9/2013 | Yoo ........................ | C09J 163/00 428/354 |
| 2013/0316155 A1* | 11/2013 | Li ........................... | C08L 63/00 428/209 |

FOREIGN PATENT DOCUMENTS

| | | |
|---|---|---|
| CN | 103992622 A | 8/2014 |
| EP | 3040357 A1 | 7/2016 |
| TW | 201623362 A | 7/2016 |

\* cited by examiner

*Primary Examiner* — David T Karst
(74) *Attorney, Agent, or Firm* — McClure, Qualey & Rodack, LLP

(57) ABSTRACT

A resin composition is provided. The resin composition comprises an epoxy resin (A) and a first hardener (B) of the following formula (I):

formula (I)

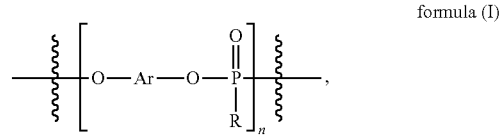

wherein Ar, R and n are as defined in the specification, and the molar ratio of the epoxy group of the epoxy resin to the active functional group of the first hardener ranges from about 1:0.4 to about 1:1.6.

12 Claims, No Drawings

RESIN COMPOSITION, AND PREPREG, METAL-CLAD LAMINATE, AND PRINTED CIRCUIT BOARD PREPARED USING THE SAME

CLAIM FOR PRIORITY

This application claims the benefit of US Provisional Patent Application No. 62/372,873, filed on Aug. 10, 2016, the subject matters of which are incorporated herein in their entirety by reference.

BACKGROUND OF THE INVENTION

Field of the Invention

The present invention relates to a resin composition, especially a halogen-free resin composition with outstanding flame retardance. The resin composition of the present invention can be used in combination with glass fibers to constitute a composite material and can be used as an adhesive for metal foil to manufacture a metal-clad laminate and a printed circuit board.

The present invention provides a resin composition which uses a first hardener with a specific structure and an epoxy resin. The electronic material obtained by curing the resin composition has good physical properties and dielectric properties. Furthermore, the first hardener contains phosphorus and thus imparts flame retardance to the resin composition and the cured product of the resin composition. In some embodiments of the present invention, the flame retardance of the resin composition and the cured product of the resin composition achieves UL-94 V1, even UL-94 V0. Therefore, the present invention can provide the desired flame retardance without the use of halogen.

Descriptions of the Related Art

Printed circuit boards (PCBs) are circuit substrates that are used for electronic devices to load other electronic components and to electrically connect the components to provide a stable circuit working environment. One kind of conventional printed circuit board is a copper clad laminate (CCL), which is primarily composed of resin(s), reinforcing material(s) and copper foil(s). Examples of resins include epoxy resins, phenolic resins, polyamine formaldehyde resins, silicone resins, and Teflon. Examples of reinforcing materials include glass fiber cloths, glass fiber mats, insulating papers, and linen cloths.

In general, a printed circuit board can be prepared by using the following method: (1) impregnating a reinforcing material such as a glass fiber fabric into a resin (such as epoxy resin), and curing the impregnated glass fiber fabric into a half-cured state, i.e., B-stage, to obtain a prepreg; (2) superimposing certain layers of the prepregs and superimposing a metal foil on at least one external surface of the superimposed prepregs to provide a superimposed object; (3) hot-pressing the superimposed object, i.e., C-stage, to obtain a metal clad laminate; etching the metal foil on the surface of the metal clad laminate to form a defined circuit pattern; and (4) finally, drilling a plurality of holes on the metal clad laminate and plating these holes with a conductive material to form via holes to accomplish the preparation of the printed circuit board.

In many applications, the electronic material requires good flame retardance. In some cases, a resin with flame resistance such as a halogenated polymer is sufficient to impart the desired flame retardance to the electronic material. If the flame retardance of a resin is insufficient to provide the desired flame retardance, it would be necessary to add a flame retardant into the resin. Examples of such flame retardant include organic halogen compounds and halogen-containing organic phosphorous compounds. However, during the curing process of a resin containing a halogen-containing compound, the halogen-containing compound will generate hydrogen halides through thermal decomposition, and the generated hydrogen halides will corrode molds and adversely affect the properties of the resin and cause discoloration of the resin. Similarly, during the recycling process (e.g., incineration processing) of the product of the cured resin, the halogen-containing compounds will generate biological hazard gases such as hydrogen halides. Hence, using a halogen-containing compound as a flame retardant does not meet the current environmental protection requirement.

SUMMARY OF THE INVENTION

In view of the aforementioned disadvantages, the present invention provides a resin composition, especially a halogen-free resin composition. The electronic material prepared using the resin composition is provided with good physical properties, dielectric properties and flame retardance.

As described in the following objectives of the present invention, the technical means of the present invention is to use a hardener with a specific structure together with an epoxy resin to provide an electronic material with the aforementioned advantages.

An objective of the present invention is to provide a resin composition, comprising:

(A) an epoxy resin; and
(B) a first hardener of formula (I):

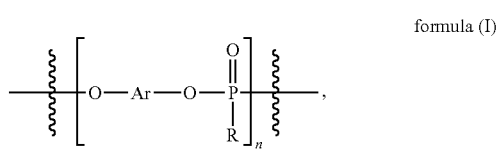

wherein, Ar is an aromatic group, and the —O—Ar—O— is a residue derived from a diphenol; R is a $C_1$ to $C_{20}$ alkyl group, a $C_2$ to $C_{20}$ alkenyl group, a $C_2$ to $C_{20}$ alkynyl group, a $C_3$ to $C_{20}$ cycloalkyl group, or a $C_6$ to $C_{20}$ aryl group; and n is an integer from 1 to 20, and wherein, the molar ratio of the epoxy group of the epoxy resin to the active functional group of the first hardener is from about 1:0.4 to about 1:1.6, and preferably from about 1:0.8 to about 1:1.2.

The first hardener may have the structure of formula (II):

formula (II)

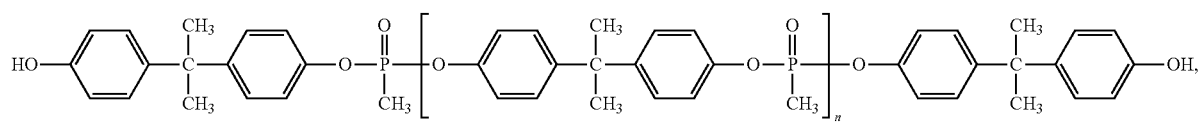

wherein, n is an integer from 1 to 10.

The —O—Ar—O— is a residue derived from a diphenol selected from the group consisting of resorcinol, hydroquinone, bisphenol A, bisphenol F, bisphenol S, 4,4'-thiodiphenol, oxydiphenol, phenolphthalein, 4,4'-(3,3,5-trimethyl-cyclohexane-1,1-diyl) diphenol, and combinations thereof.

In the resin composition of the present invention, the number average molecular weight (Mn) of the first hardener can range from about 1000 g/mol to about 3000 g/mol, such as from about 2000 g/mol to about 2500 g/mol.

In the resin composition of the present invention, the epoxy resin can be selected from the group consisting of dicyclopentadiene-type (DCPD-type) epoxy resin, phenolic-type epoxy resin, bisphenol-type epoxy resin, diphenylethylene-type epoxy resin, triazine skeleton-containing epoxy resin, fluorene skeleton-containing epoxy resin, tri(4-hydroxyphenyl)methane-type epoxy resin, biphenyl-type epoxy resin, xylylene-type epoxy resin, biphenyl aralkyl-type epoxy resin, naphthalene-type epoxy resin, alicyclic epoxy resin, and combinations thereof.

The resin composition of the present invention may further comprise a catalyst. The catalyst can be an unsubstituted- or substituted-imidazole, an unsubstituted- or substituted-pyridine, or a combination thereof, and is preferably an unsubstituted- or substituted-pyridine. For example, the catalyst can be selected from the group consisting of 2,3-diaminopyridine, 2,5-diaminopyridine, 2,6-diaminopyridine, 4-dimethylaminopyridine, 2-amino-3-methylpyridine, 2-amino-4-methylpyridine, 2-amino-3-nitropyridine and combinations thereof. The amount of the catalyst can range from about 0.1 wt % to about 1 wt % based on the dry weight of the resin composition.

The resin composition of the present invention may further comprise a second hardener and/or a filler. The second hardener can be selected from the group consisting of cyanate ester resin, benzoxazine resin, phenol novolac resin (PN), styrene maleic anhydride resin (SMA), dicyandiamide (Dicy), diaminodiphenyl sulfone (DDS), amino triazine novolac resin (ATN), diaminodiphenylmethane, poly(styrene-co-vinyl phenol), and combinations thereof. The filler can be selected from the group consisting of silicon dioxide, aluminum oxide, magnesium oxide, magnesium hydroxide, calcium carbonate, talc, clay, aluminum nitride, boron nitride, aluminum hydroxide, silicon aluminum carbide, silicon carbide, sodium carbonate, titanium dioxide, zinc oxide, zirconium oxide, quartzs, diamonds, diamond-like, graphite, calcined kaolin, pryan, mica, hydrotalcite, hollow silicon dioxide, polytetrafluoroethylene (PTFE) powders, glass beads, ceramic whiskers, carbon nanotubes, nanosized inorganic powders, and combinations thereof.

Another objective of the present invention is to provide a prepreg, which is prepared by impregnating or coating a substrate with the above-mentioned resin composition and drying the impregnated or coated substrate.

Yet another objective of the present invention is to provide a metal-clad laminate, which is prepared from the above-mentioned prepreg, or by directly coating the above-mentioned resin composition onto a metal foil and drying the coated metal foil.

Yet another objective of the present invention is to provide a printed circuit board, which is prepared from the above-mentioned metal-clad laminate.

To render the above objectives, technical features and advantages of the present invention more apparent, the present invention will be described in detail with reference to some embodiments hereinafter.

BRIEF DESCRIPTION OF THE DRAWINGS

Not applicable.

DESCRIPTION OF THE PREFERRED EMBODIMENT

Hereinafter, some embodiments of the present invention will be described in detail. However, without departing from the spirit of the present invention, the present invention may be embodied in various embodiments and should not be limited to the embodiments described in the specification. Furthermore, for clarity, the size of each element and each area may be exaggerated in the appended drawings and not depicted in actual proportion. Unless it is additionally explained, the expressions "a," "the," or the like recited in the specification (especially in the claims) should include both the singular and the plural forms. Furthermore, unless it is additionally explained, while describing the constituents in the solution, mixture and composition in the specification, the amount of each constituent is calculated based on the dry weight, i.e., regardless of the weight of the solvent.

The resin composition of the present invention uses epoxy resin with a first hardener that has a specific structure and is capable of providing an electronic material with good physical properties, dielectric properties and flame retardance without using a halogen-containing flame retardant.

Resin Composition

The resin composition of the present invention comprises an epoxy resin and a first hardener. The components of the resin composition will be described in detail hereinafter.

[Epoxy Resin]

As used herein, an epoxy resin refers to a thermosetting resin with at least two epoxy functional groups in each molecule, such as a multi-functional epoxy resin, a linear phenolic epoxy resin, or a combination thereof, and is preferably a halogen-free epoxy resin.

Examples of the multi-functional epoxy resin include a bifunctional epoxy resin, a tetrafunctional epoxy resin, an octafunctional epoxy resin, and the like. Examples of the epoxy resin include but are not limited to dicyclopentadiene-type (DCPD-type) epoxy resins, phenolic-type epoxy resins, bisphenol-type epoxy resins, diphenylethylene-type epoxy resin, triazine skeleton-containing epoxy resins, fluorene skeleton-containing epoxy resins, tri(4-hydroxyphenyl) methane-type epoxy resins, biphenyl-type epoxy resins, xylylene-type epoxy resins, biphenyl aralkyl-type epoxy resins, naphthalene-type epoxy resins, alicyclic epoxy resins, and combinations thereof. Examples of the phenolic-type epoxy resin include but are not limited to cresol phenolic-type epoxy resin, bisphenol A phenolic-type epoxy resin and bisphenol F phenolic-type epoxy resins. Examples of bisphenol-type epoxy resins include but are not limited to bisphenol A-type epoxy resins, bisphenol F-type epoxy resins and bisphenol S-type epoxy resins. Examples of the epoxy resin also include diglycidyl ether compounds of multi-ring aromatics such as multi-functional phenols and anthracenes. Furthermore, phosphorous may be introduced into the epoxy resin to provide a phosphorous-containing epoxy resin.

The above-mentioned epoxy resins can either be used alone or in combination depending on the need of persons with ordinary skill in the art. In some embodiments of the present invention, phenolic-type epoxy resins and dicyclopentadiene-type epoxy resins are used in the resin composition.

[First Hardener]

The first hardener is a flame retardant hardener containing phosphorus with reactive end group(s) (e.g., hydroxyl group), and has the structure of the following formula (I):

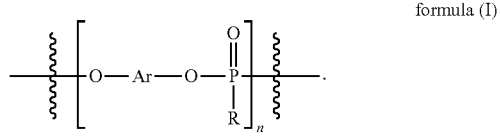

formula (I)

In formula (I), Ar is an aromatic group. The —O—Ar—O— is a residue derived from a diphenol, such as resorcinol, hydroquinone, bisphenol A, bisphenol F, bisphenol S, 4,4'-thiodiphenol, dihydroxy diphenyl ether, phenolphthalein, or 4,4'-(3,3,5-trimethyl-cyclohexane-1,1-diyl)diphenol; R is a $C_1$ to $C_{20}$ alkyl group, a $C_2$ to $C_{20}$ alkenyl group, a $C_2$ to $C_{20}$ alkynyl group, a $C_3$ to $C_{20}$ cycloalkyl group, or a $C_6$ to $C_{20}$ aryl group; and n is an integer from 1 to 20, such as an integer from 1 to 15, 1 to 10 or 1 to 5. Examples of the $C_1$ to $C_{20}$ alkyl groups include but are not limited to methyl, ethyl, n-propyl, isopropyl, n-butyl and isobutyl. Examples of $C_2$ to $C_{20}$ alkenyl groups include but are not limited to vinyl, allyl, but-1-enyl and but-2-enyl. Examples of the $C_2$ to $C_{20}$ alkynyl groups include but are not limited to ethynyl and prop-1-ynyl. Examples of the $C_3$ to $C_{20}$ cycloalkyl groups include but are not limited to cyclopropyl, cyclobutyl, cyclopentyl and cyclohexyl. Examples of the $C_6$ to $C_{20}$ aryl groups include but are not limited to phenyl, naphthyl, and anthranyl.

In some embodiments of the present invention, the first hardener has the structure of the following formula (II):

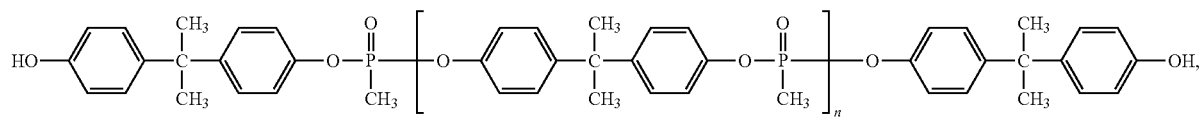

formula (II)

wherein n is an integer from 1 to 10.

The first hardener contains phosphorus and thus imparts flame retardance to the resin composition. Furthermore, a conventional additive-type flame retardant cannot crosslink with other components of the resin composition. The first hardener has reactive end group(s) and thus can crosslink with other components of the resin composition to thereby achieve better physical properties, such as better mechanical strength and heat resistance. Furthermore, the number average molecular weight (Mn) of the first hardener preferably ranges from about 1000 g/mol to about 3000 g/mol, more preferably from about 1200 g/mol to about 2800 g/mol, and most preferably from about 2000 g/mol to about 2500 g/mol, such as about 2100 g/mol, about 2150 g/mol, about 2200 g/mol, about 2250 g/mol, about 2300 g/mol, about 2350 g/mol or about 2400 g/mol. It has been found that when the number average molecular weight of the first hardener is within the above designated range, the electronic material prepared from the resin composition is provided with better properties, including better flame retardance and higher glass transition temperature (Tg).

In the resin composition of the present invention, the amount of the epoxy resin and the first hardener depends on the molar ratio of the epoxy group of the epoxy resin to the reactive functional group of the first hardener. Specifically, the mole ratio of the epoxy group of the epoxy resin to the reactive functional group of the first hardener ranges from about 1:0.4 to about 1:1.6, and preferably from about 1:0.8 to about 1:1.2. When the molar ratio of the epoxy group of the epoxy resin to the reactive functional group of the first hardener is within the designated range, the crosslinking reaction between the components of the resin composition is more complete and thus, the electronic material prepared from the resin composition has better glass transition temperature (Tg). In particular, as shown in the appended examples, when the molar ratio of the epoxy group of the epoxy resin to the reactive functional group of the first hardener ranges from about 1:0.8 to about 1:1.2, the glass transition temperature (Tg) of the electronic material prepared from the resin composition is particularly high.

[Catalyst]

In some embodiments of the present invention, the resin composition further comprises a catalyst to promote the reaction of epoxy functional groups and lower the curing reaction temperature of the resin composition. The catalyst can be any substance that can promote the ring-opening reaction of epoxy functional groups and lower the curing reaction temperature. For example, the catalyst can be a tertiary amine, a quaternary ammonium salt, an unsubstituted- or substituted-imidazole, or an unsubstituted- or substituted-pyridine. Each of the aforementioned catalyst can either be used alone or in combination. In some embodiments of the present invention, the catalyst is an unsubstituted- or substituted-imidazole, an unsubstituted- or substituted-pyridine, or a combination thereof, and preferably an unsubstituted- or substituted-pyridine. For example, the catalyst can be selected from the group consisting of 2,3-diaminopyridine, 2,5-diaminopyridine, 2,6-diaminopyridine, 4-dimethylaminopyridine, 2-amino-3-methylpyridine, 2-amino-4-methylpyridine, 2-amino-3-nitropyridine and combinations thereof. As shown in the appended examples, pyridine can more effectively catalyze the curing of the resin composition of the present invention and make the curing reaction more complete and thus, the glass transition temperature (Tg) of the electronic material prepared therefrom particularly high.

In general, based on the dry weight of the resin composition, the amount of the catalyst ranges from about 0.1 wt % to about 1 wt %, such as about 0.2 wt %, about 0.3 wt %, about 0.4 wt %, about 0.5 wt %, about 0.6 wt %, about 0.7 wt %, about 0.8 wt %, or about 0.9 wt %, but the present invention is not limited thereto. The amount of the catalyst can be adjusted depending on the need of persons with ordinary skill in the art.

[Second Hardener]

In some embodiments of the present invention, the resin composition further comprises a second hardener. The second hardener can be any hardener suitable for an epoxy resin, such as a compound containing hydroxyl group(s), a compound containing amino group(s), an anhydride compound, and an active ester compound. Examples of the second hardener include but are not limited to a cyanate ester resin, a benzoxazine resin, a phenol novolac resin (PN), a styrene maleic anhydride resin (SMA), dicyandiamide (Dicy), diaminodiphenyl sulfone (DDS), amino triazine novolac resin (ATN), diaminodiphenylmethane, poly(styrene-co-vinyl phenol), and combinations thereof. In some embodiments of the present invention, the second hardener is cyanate ester resin, benzoxazine resin or a combination thereof.

The cyanate ester resin refers to a chemical substance based on a bisphenol or phenolic derivative, in which the hydrogen atom of at least one OH groups of the derivative is substituted by a cyanide group. Cyanate ester resin usually has —OCN group(s) and can form trimers through cross-linking reaction. Examples of the cyanate ester resin include but are not limited to 4,4'-ethylidenebisphenylene cyanate, 4,4'-dicyanatobiphenyl, 2,2-bis(4-cyanatophenyl)propane, bis(4-cyanato-3,5-dimethylphentyl)methane, bis(4-cyanatophenyl)thioether, bis(4-cyanatophenyl)ether, prepolymer of bisphenol dicyanate in methyl ethyl ketone, 1,1-bis(4-cyanatophenyl)ethane, 1,1-bis(4-cyanatophenyl)methane, 1,3-bis[4-cyanatophenyl-1-(methylethylidene)]benzene, bis(4-cyanatophenyl)ether, bis(4-cyanatophenyl)-2,2-butane, 1,3-bis[2-(4-cyanatophenyl)propyl]benzene, tris(4-cyanatophenyl)ethane, cyanater novolak, and cyanated phenoldicyclopentadiene adduct.

Benzoxazine resin refers to a chemical substance prepared by a phenolic hydroxy compound, a primary amine and a formaldehyde according to the following reaction.

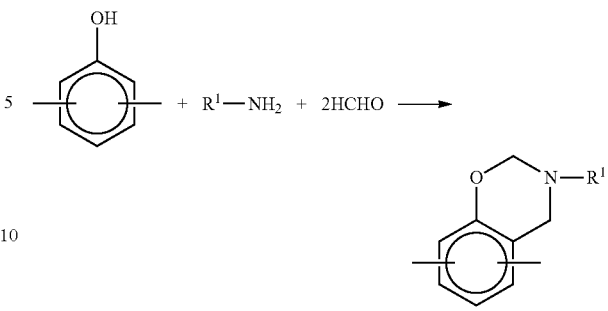

In the above reaction equation, examples of the phenolic hydroxy compound include but are not limited to multi-functional phenol compounds (e.g., catechol, resorcinol, or hydroquinone), biphenol compounds, bisphenol compounds (such as bisphenol A, bisphenol F, or bisphenol S), trisphenol compound, and a phenolic resin (e.g. novolac varnish resin or melamine phenolic resin). $R^1$ group of the primary amine ($R^1$—$NH_2$) can be an alkyl group, a cycloalkyl group, an un-substituted phenyl group, or a phenyl group substituted by an alkyl group or alkoxy group. Examples of the primary amine include but are not limited to methylamine and substituted or unsubstituted aniline. Formaldehyde (HCHO) can be provided by formalin or paraformaldehyde.

The benzoxazine resin can be added into the resin composition of the present invention in the form of its prepolymer by conducting a ring-opening polymerization in advance. The preparation and use of such prepolymer can be found in such as US 2012/0097437 A1 (Applicant: Taiwan Union Technology Corporation), the full text of which is incorporated herein in itsentirety by reference.

In general, based on the dry weight of the resin composition, the amount of the second hardener ranges from about 5 wt % to about 25 wt %, such as about 6 wt %, about 7%, about 8%, about 9 wt %, about 10 wt %, about 12 wt %, about 14 wt %, about 16 wt %, about 18 wt %, about 20 wt %, or about 22 wt %, but the present invention is not limited thereto. The amount of the seconder hardeners can be adjusted depending on the need of persons with ordinary skill in the art.

[Filler]

In some embodiments of the present invention, the resin composition further comprises a filler. Examples of the filler include but are not limited to the organic or inorganic fillers selected from the group consisting of silicon dioxide, aluminum oxide, magnesium oxide, magnesium hydroxide, calcium carbonate, talc, clay, aluminum nitride, boron nitride, aluminum hydroxide, silicon aluminum carbide, silicon carbide, sodium carbonate, titanium dioxide, zinc oxide, zirconium oxide, quartzs, diamonds, diamond-like, graphite, calcined kaolin, pryan, mica, hydrotalcite, hollow silicon dioxide, polytetrafluoroethylene (PTFE) powders, glass beads, ceramic whiskers, carbon nanotubes, nanosized inorganic powders, and combinations thereof.

In general, based on the dry weight of the resin composition, the amount of the filler ranges from 0 wt % to 40 wt %, such as about 1 wt %, about 3 wt %, about 5 wt %, about 7 wt %, about 10 wt %, about 15 wt %, about 20 wt %, about 25 wt %, about 30 wt %, or about 35 wt %, but the present invention is not limited thereto. The amount of the filler can be adjusted depending on the need of persons with ordinary skill in the art.

[Other Optional Components]

In addition to the above-mentioned components, the resin composition of the present invention may optionally further comprise other components to improve the physicochemical properties of the resultant electronic material or the workability of the resin composition during manufacturing. Such components include additives that are well-known to persons with ordinary skill in the art, such as a dispersant agent, a toughener, a viscosity modifier and a flame retardant. Use of such additives is not a critical part of the present invention, and because many varieties of such use are known in the art, it will not be described in detail herein.

Preparation of Resin Composition

The resin composition of the present invention may be prepared into varnish form for subsequent applications by evenly mixing the epoxy resin, the first hardener, the catalyst, the second hardener, the filler, and other optional components through a stirrer and dissolving or dispersing the obtained mixture into a solvent. The solvent here can be any inert solvent that can dissolve or disperse the components of the resin composition, but does not react with the components of the resin composition. Examples of the solvent that can dissolve or disperse the components of the resin composition include but are not limited to toluene, γ-butyrolactone, methyl ethyl ketone, cyclohexanone, butanone, acetone, xylene, methyl isobutyl ketone, N,N-dimethylformamide (DMF), N,N-dimethylacetamide (DMAc), and N-methylpyrolidone (NMP). The solvents can either be used alone or in combination. In some embodiments of the present invention, the solvent is a mixture of toluene, methyl ethyl ketone and γ-butyrolactone. The amount of the solvent is not particularly limited as long as the components of the resin composition can be evenly dissolved or dispersed therein.

Prepreg

The present invention also provides a prepreg prepared by impregnating or coating a substrate with the above-mentioned resin composition and drying the impregnated or coated substrate. Examples of the substrate include but are not limited to glass fiber reinforcing material (e.g., glass-fiber woven fabrics or non-woven fabrics, glass papers, or glass mats), kraft papers, short fiber cotton papers, nature fiber cloths, and organic fiber cloths (e.g., cloths of liquid crystal polymer fiber). In some embodiments of the present invention, a semi-cured prepreg is prepared, wherein the substrate is a 2116 glass fiber cloth. The drying step is carried out at 175° C. for 2 to 15 minutes (B-stage).

Metal-Clad Laminate and Printed Circuit Board

The present invention also provides a metal-clad laminate prepared from the above-mentioned resin composition or prepreg. The metal-clad laminate comprises a dielectric layer and a metal layer. The dielectric layer is provided by the abovementioned prepreg or just the cured product of the resin composition. Specifically, the metal-clad laminate can be prepared by superimposing a plurality of prepregs and superimposing a metal foil (such as a copper foil) on at least one external surface of the dielectric layer composed of the superimposed prepregs to provide a superimposed object, and performing a hot-pressing operation onto the superimposed object to obtain the metal-clad laminate. Alternatively, the metal-clad laminate can be prepared by directly coating the resin composition onto a metal foil and drying the coated metal foil to obtain the metal-clad laminate. Furthermore, a printed circuit board can be prepared by patterning the external metal foil of the metal-clad laminate.

The present invention will be further illustrated by the embodiments hereinafter, wherein the measuring instruments and methods are respectively as follows:

[Glass Transition Temperature (Tg) Test]

The glass transition temperature (Tg) is measured by using a Differential Scanning calorimeter (DSC), wherein the measuring methods are IPC-TM-650.2.4.25C and 24C testing method of the Institute for Interconnecting and Packaging Electronic Circuits (IPC).

[Peeling Strength Test]

The peeling strength refers to the bonding strength between the metal foil and hot-pressed laminated prepreg, which is expressed by the force required for vertically peeling the clad copper foil (0.5 oz.) with a width of ⅛ inch from the surface of the hot-pressed laminated prepreg.

[Thermal Decomposition Temperature (Td) Test]

The thermal decomposition temperature test is carried out by using a Thermogravimetric Analysis (TGA). The programmed heating rate is 10° C. per minute. The thermal decomposition temperature is a temperature at which the weight of the sample decreases by 5% from the initial weight. The measuring methods are IPC-TM-650.2.4.24.6 testing methods of the Institute for Interconnecting and Packaging Electronic Circuits (IPC).

[Solder Resistance Test]

The solder resistance test is carried out by immersing the dried metal-clad laminate in a solder bath at 288° C. for 20 seconds several times and observing whether there is any defects, such as delamination and blistering, to evaluate how many times such an immersion tolerable.

[Flame Retardance Test]

The flame retardance test is carried out according to UL94V (Vertical Burn), which comprises the burning of a laminate, which is held vertically, using a Bunsen burner to compare its self-extinguishing properties and combustion-supporting properties. The rank for the flame retardance level is V0>V1>V2.

[Dielectric Constant (Dk) and Dissipation Factor (Df) Measurement]

Dielectric constant (Dk) and dissipation factor (Df) are measured by a split post dielectric resonator (SPDR) according to ASTM D150 under an operating frequency of 10 GHz. The resin content (RC) of the tested prepreg is about 55%.

EXAMPLES

Raw Material List:

| Model No. | Description |
| --- | --- |
| BNE-210 | Phenolic type epoxy resin, available from Chang Chun (CCP) Company |
| PNE-177 | Phenolic type epoxy resin, available from Chang Chun Company |
| DNE-260 | DCPD type epoxy resin, available from Chang Chun Company |
| OL-1001 | First hardener (Mn: 1500 g/mol), available from FRX Company |
| OL-3001 | First hardener (Mn: 2500 g/mol), available from FRX Company |
| Nanozine-256 | Cyanate ester resin, available from Nanokor Company |
| HS11100 | Benzoxazine resin, available from Mountain Hui Company |
| G2C | $SiO_2$ filler, available from Sibelco Company |
| 525ARI | $SiO_2$ filler, available from Sibelco Company |
| 2MI | Catalyst, available from Union Chemical Company |
| DMAP | Catalyst, available from Sigma-Aldrich Company |
| 2E4MZ | Catalyst, available from Union Chemical Company |

Embodiment 1: Effect of the Ratio of the Epoxy Resin and First Hardener

The resin compositions of Examples 1 to 4 were prepared according to the constitutions shown in Table 1. Each component was mixed under room temperature with a stirrer, followed by adding toluene, methyl ethyl ketone, and γ-butyrolactone (all available from Fluka Company) thereinto. After stirring the resultant mixture under room temperature for 60 to 120 minutes, the resin compositions were obtained.

The prepregs and metal-clad laminates of Examples 1 to 4 were respectively prepared by using the prepared resin compositions. In detail, one of the resin compositions was coated on glass fiber cloths (type: 2116; thickness: 0.08 mm) by a roller with a controlled thickness. The coated glass fiber cloths were then placed in an oven and dried at 175° C. for 2 to 15 minutes to produce prepregs in a half-cured state (B-stage) (the resin content of the prepreg was about 55%). Several pieces of the prepregs were superimposed and two sheets of copper foil (0.5 oz.) were respectively superimposed on both of the two external surfaces of the superimposed prepregs to provide a superimposed object. A hot-pressing operation was performed on each of the prepared objects. The hot-pressing conditions are as follows: raising the temperature to about 200° C. to 220° C. with a heating rate of 3.0° C./min, and hot-pressing for 180 minutes under a full pressure of 15 kg/cm² (initial pressure is 8 kg/cm²) at said temperature.

The properties of the prepregs and metal-clad laminates of Examples 1 to 4, including glass transition temperature (Tg), peeling strength, thermal decomposition temperature (Td), solder resistance, flame retardance, dielectric constant (Dk) and dissipation factor (Df), were measured according to the aforementioned testing methods, and the results are tabulated in Table 1.

TABLE 1

| Unit: parts by weight | | Example 1 | Example 2 | Example 3 | Example 4 |
|---|---|---|---|---|---|
| Phenolic-type epoxy resin (BNE-210) | | 100 | 100 | 100 | 100 |
| Phenolic-type epoxy resin (PNE-177) | | 200 | 200 | 200 | 200 |
| First hardener (OL-3001) | | 90 | 180 | 270 | 360 |
| SiO₂ filler (G2C) | | 170 | 210 | 250 | 280 |
| Catalyst (2MI) | | 2 | 2.4 | 2.9 | 3.3 |
| Molar ratio (epoxy group of epoxy resin:reactive functional group of first hardener) | | 1:0.4 | 1:0.8 | 1:1.2 | 1:1.6 |
| Properties of laminate | DSC Tg (° C.) | 149/153 | 176/178 | 176/176 | 152/154 |
| | Peeling strength (lb/in) | 5.6 | 5.8 | 5.9 | 6.1 |
| | Td 5% (° C.) | 373 | 361 | 358 | 342 |
| | Solder resistance (min) | >20 | >20 | >20 | >20 |
| | UL-94 | V1 | V0 | V0 | V0 |
| Dielectric properties | DK @ 10 GHz (RC: 55%) | 4.3 | 4.3 | 4.3 | 4.3 |
| | Df @ 10 GHz (RC: 55%) | 0.016 | 0.014 | 0.012 | 0.011 |

As shown in Table 1, when the molar ratio of the epoxy group of epoxy resin to the to the active functional group of the first hardener ranges from 1:0.4 to 1:1.6, the electronic material prepared from the resin composition is provided with good laminate properties and dielectric properties. In particular, when the molar ratio of the epoxy group of the epoxy resin to the active functional group of the first hardener ranges from about 1:0.8 to about 1:1.2 (Examples 2 and 3), the glass transition temperature (Tg) of the electronic material prepared from the resin composition is further improved and the flame retardance of the same achieves UL-94 V0.

Embodiment 2: Effect of the Molecular Weight of the First Hardener

The resin compositions of Examples 5 and 6 were prepared according to the constitutions shown in Table 2. Each component was mixed under room temperature with a stirrer, followed by adding toluene, methyl ethyl ketone, and γ-butyrolactone (all available from Fluka Company) thereinto. After stirring the resultant mixture under room temperature for 60 to 120 minutes, the resin compositions were obtained.

The prepregs and metal-clad laminates of Examples 5 and 6 were prepared using the above resin compositions according to the same procedure of Embodiment 1. The properties of the prepared prepregs and metal-clad laminates, including glass transition temperature g), peeling strength, thermal decomposition temperature (Td), solder resistance, flame retardauce, dielectric constant (Dk) and dissipation factor (Df), were measured according to the aforementioned testing methods and the results are tabulated in Table 2.

TABLE 2

| Unit: parts by weight | | Example 5 | Example 6 |
|---|---|---|---|
| DCPD-type epoxy resin (DNE-260) | | 120 | 120 |
| Phenolic-type epoxy resin (PNE-177) | | 130 | 130 |
| First hardener (OL-1001; Mn: 1500) | | 162 | — |
| First hardener (OL-3001; Mn: 2500) | | — | 162 |
| SiO₂ filler (525ARI) | | 160 | 160 |
| Catalyst (2MI) | | 0.6 | 0.62 |
| Molar ratio (epoxy group of epoxy resin:reactive functional group of first hardener) | | 1:1.2 | 1:1.2 |
| Properties of laminate | DSC Tg (° C.) | 130/139 | 150/152 |
| | Peeling strength (lb/in) | 4.9 | 5.2 |
| | Td 5% (° C.) | 370 | 353 |
| | Solder resistance (min) | >20 | >20 |
| | UL-94 | V1 | V0 |
| Dielectric properties | DK @ 10 GHz (RC: 55%) | 4.1 | 4.1 |
| | Df @ 10 GHz (RC: 55%) | 0.015 | 0.012 |

As shown in Table 2, the molecular weight of the first hardener used in the resin composition is 1500 g/mol or 2500 g/mol, and the electronic material prepared from the resin composition is provided with good laminate properties and dielectric properties. In particular, when the molecular weight of the first hardener in the resin composition is 2500 g/mol (Example 6), the glass transition temperature (Tg) of the electronic material prepared from the resin composition is further improved and the flame retardance of the same achieves UL-94 V0.

Embodiment 3: Effect of the Catalyst

The resin compositions of Examples 7 to 10 were prepared according to the constitutions shown in Table 3. Each component was mixed under room temperature with a stirrer, followed by adding toluene, methyl ethyl ketone, and γ-butyrolactone (all available from Fluka Company) thereinto. After stirring the resultant mixture under room temperature for 60 to 120 minutes, the resin compositions were obtained.

The prepregs and metal-clad laminates of Examples 7 to 10 were prepared using the above resin compositions according to the same procedure of Embodiment 1. The properties of the prepared prepregs and metal-clad laminates, including glass transition temperature (Tg), peeling strength, thermal decomposition temperature (Td) solder resistance, flame retardance, dielectric constant (Dk) and dissipation factor (Df), were measured according to the aforementioned testing methods and the results are tabulated in Table 3.

TABLE 3

| Unit: parts by weight | | Example 7 | Example 8 | Example 9 | Example 10 |
|---|---|---|---|---|---|
| DCPD-type epoxy resin (DNE-260) | | 120 | 120 | 120 | 120 |
| Phenolic-type epoxy resin (PNE-177) | | 130 | 130 | 130 | 130 |
| First hardener (OL-1001; Mn: 1500) | | 162 | — | 162 | — |
| First hardener (OL-3001; Mn: 2500) | | — | 162 | — | 162 |
| $SiO_2$ filler (525ARI) | | 160 | 160 | 160 | 160 |
| Catalyst (2MI) | | 0.6 | 0.62 | — | — |
| Catalyst (DMAP) | | — | — | 0.5 | 0.5 |
| Molar ratio (epoxy group of epoxy resin:reactive functional group of first hardener) | | 1:1.2 | 1:1.2 | 1:1.2 | 1:1.2 |
| Properties of laminate | DSC Tg (° C.) | 130/139 | 150/152 | 160/163 | 169/170 |
| | Peeling strength (lb/in) | 4.9 | 5.2 | 4.9 | 5.4 |
| | Td 5% (° C.) | 370 | 353 | 350 | 342 |
| | Solder resistance (min) | >20 | >20 | >20 | >20 |
| | UL-94 | V1 | V0 | V1 | V0 |
| Dielectric properties | DK @ 10 GHz (RC: 55%) | 4.1 | 4.1 | 4.1 | 4.1 |
| | Df @ 10 GHz (RC: 55%) | 0.015 | 0.012 | 0.014 | 0.011 |

As shown in Table 3, when imidazole (2MI) or pyridine (DMAP) is used as a catalyst in the resin composition, the electronic material prepared from the resin composition is provided with good laminate properties and dielectric properties. In particular, in the case of using pyridine (Examples 9 and 10), the glass transition temperature (Tg) of the prepared electronic material is further improved. This result shows that pyridine can make the crosslinking reaction more complete and is therefore a more suitable catalyst for the resin composition of the present invention. Furthermore, when the molecular weight of the first hardener in the resin composition is 2500 g/mol (Examples 8 and 10), the flame retardance of the electronic material prepared from the resin composition achieves UL-94 V0.

Embodiment 4: Effect of the Second Hardener

The resin compositions of Examples 11 to 14 were prepared according to the constitutions shown in Table 4. Each component was mixed under room temperature with a stirrer, followed by adding toluene, methyl ethyl ketone, and γ-butyrolactone (all available from Fluka Company) thereinto. After stirring the resultant mixture under room temperature for 60 to 120 minutes, the resin compositions were obtained.

The prepregs and metal-clad laminates of Examples 11 to 14 were prepared using the above resin compositions according to the same procedure of Embodiment 1. The properties of the prepared prepregs and metal-clad laminates, including glass transition temperature (Tg), peeling strength, thermal decomposition temperature (Td), solder resistance, flame retardance, dielectric constant (Dk) and dissipation factor (Df), were measured according to the aforementioned testing methods and the results are tabulated in Table 4.

TABLE 4

| Unit: parts by weight | | Example 11 | Example 12 | Example 13 | Example 14 |
|---|---|---|---|---|---|
| DCPD-type epoxy resin (DNE-260) | | 120 | 120 | 120 | 120 |
| Phenolic-type epoxy resin (PNE-177) | | 130 | 130 | 130 | 130 |
| Cyanate ester resin (Nanozine-256) | | 60 | 60 | 122 | 60 |
| Benzoxazine resin (HS11100) | | — | 10 | — | 60 |
| First hardener (OL-3001) | | 160 | 160 | 160 | 160 |
| $SiO_2$ filler (525ARI) | | 200 | 200 | 200 | 200 |
| Catalyst (2E4MZ) | | 5.5 | 3.1 | 0.3 | 0.3 |
| Molar ratio (epoxy group of epoxy resin:reactive functional group of first hardener) | | 1:1.2 | 1:1.2 | 1:1.2 | 1:1.2 |
| Properties of laminate | DSC Tg (° C.) | 165/171 | 152/158 | 173/178 | 169/173 |
| | Peeling strength (lb/in) | 5.3 | 4.9 | 5.0 | 4.8 |
| | Td 5% (° C.) | 336 | 339 | 329 | 315 |
| | Solder resistance (min) | >20 | >20 | >20 | >20 |
| | UL-94 | V0 | V0 | V1 | V1 |
| Dielectric properties | DK @ 10 GHz (RC: 55%) | 3.9 | 4.0 | 3.8 | 4.0 |
| | Df @ 10 GHz (RC: 55%) | 0.010 | 0.012 | 0.010 | 0.012 |

As shown in Table 4, when the resin composition further comprises cyanate ester resin and benzoxazine resin, the electronic material prepared from the resin composition is provided with good laminate properties and dielectric properties. In addition, when the amount of the cyanate ester resin and benzoxazine resin is increased, the glass transition temperature (Tg) of the electronic material can be further improved.

The above examples are used to illustrate the principle and efficacy of the present invention and show the inventive features thereof. People skilled in this field may proceed with a variety of modifications and replacements based on the disclosures and suggestions of the invention as described without departing from the principle and spirit thereof. Therefore, the scope of protection of the present invention is that as defined in the claims as appended.

What is claimed is:

1. A resin composition, comprising:
   (A) an epoxy resin selected from the group consisting of dicyclopentadiene-type (DCPD-type) epoxy resin, phenolic-type epoxy resin, bisphenol-type epoxy resin, diphenylethylene-type epoxy resin, triazine skeleton-containing epoxy resin, fluorene skeleton-containing epoxy resin, tri(4-hydroxyphenyl)methane-type epoxy resin, biphenyl-type epoxy resin, xylylene-type epoxy resin, biphenyl aralkyl-type epoxy resin, naphthalene-type epoxy resin, alicyclic epoxy resin, and combinations thereof;

(B) a first hardener of formula (II):

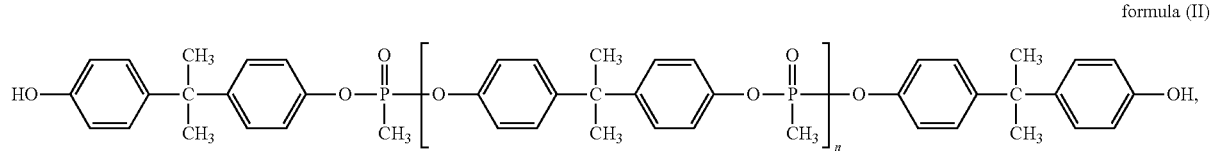

formula (II)

wherein n is an integer from 1 to 10; and
a catalyst selected from the group consisting of 2,3-diaminopyridine, 2,5-diaminopyridine, 2,6-diaminopyridine, 4-dimethylaminopyridine, 2-amino-3-methylpyridine, 2-amino-4-methylpyridine, 2-amino-3-nitropyridine and combinations thereof,
wherein, the molar ratio of the epoxy group of the epoxy resin to the active functional group of the first hardener is from about 1:0.4 to about 1:1.6, and
wherein the amount of the catalyst is from about 0.1 wt % to about 1 wt % based on the dry weight of the resin composition.

2. The resin composition of claim 1, wherein the molar ratio of the epoxy group of the epoxy resin to the active functional group of the first hardener is from about 1:0.8 to about 1:1.2.

3. The resin composition of claim 1, wherein the number average molecular weight (Mn) of the first hardener is from about 1000 g/mol to about 3000 g/mol.

4. The resin composition of claim 1, wherein the number average molecular weight of the first hardener is from about 2000 g/mol to about 2500 g/mol.

5. The resin composition of claim 1, wherein the epoxy resin is dicyclopentadiene-type epoxy resin, phenolic-type epoxy resin or a combination of the foregoing.

6. The resin composition of claim 1, further comprising a second hardener selected from the group consisting of cyanate ester resin, benzoxazine resin, phenol novolac resin (PN), styrene maleic anhydride resin (SMA), dicyandiamide (Dicy), diaminodiphenyl sulfone (DDS), amino triazine novolac resin (ATN), diaminodiphenylmethane, poly(styrene-co-vinyl phenol), and combinations thereof.

7. The resin composition of claim 1, further comprising a filler selected from the group consisting of silicon dioxide, aluminum oxide, magnesium oxide, magnesium hydroxide, calcium carbonate, talc, clay, aluminum nitride, boron nitride, aluminum hydroxide, silicon aluminum carbide, silicon carbide, sodium carbonate, titanium dioxide, zinc oxide, zirconium oxide, quartzs, diamonds, diamond-like, graphite, calcined kaolin, pryan, mica, hydrotalcite, hollow silicon dioxide, polytetrafluoroethylene (PTFE) powders, glass beads, ceramic whiskers, carbon nanotubes, nanosized inorganic powders, and combinations thereof.

8. A prepreg, which is prepared by impregnating or coating a substrate with the resin composition of claim 1 and drying the impregnated or coated substrate.

9. A metal-clad laminate, which is prepared from the prepreg of claim 8.

10. A printed circuit board, which is prepared from the metal-clad laminate of claim 9.

11. A metal-clad laminate, which is prepared by directly coating the resin composition of claim 1 onto a metal foil and drying the coated metal foil.

12. A printed circuit board, which is prepared from the metal-clad laminate of claim 11.

* * * * *